United States Patent
Byun et al.

(10) Patent No.: US 12,389,630 B2
(45) Date of Patent: Aug. 12, 2025

(54) VERTICAL CHANNEL TRANSISTOR INCLUDING A GRAPHENE INSERTION LAYER BEWEEEN A SOURCE/DRAIN ELECTRODE AND A CHANNEL PATTERN

(71) Applicant: Samsung Electronics Co., Ltd., Suwon-si (KR)

(72) Inventors: Kyung-Eun Byun, Seongnam-si (KR); Sangwon Kim, Seoul (KR); Changhyun Kim, Seoul (KR); Keunwook Shin, Yongin-si (KR); Changseok Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 742 days.

(21) Appl. No.: 17/697,400

(22) Filed: Mar. 17, 2022

(65) Prior Publication Data

US 2023/0081960 A1 Mar. 16, 2023

(30) Foreign Application Priority Data

Sep. 10, 2021 (KR) .......................... 10-2021-0121173

(51) Int. Cl.
| | |
|---|---|
| *H10D 30/63* | (2025.01) |
| *H10D 62/13* | (2025.01) |
| *H10D 62/17* | (2025.01) |
| *H10D 64/23* | (2025.01) |
| *H10D 64/27* | (2025.01) |

(52) U.S. Cl.
CPC .......... *H10D 30/63* (2025.01); *H10D 62/151* (2025.01); *H10D 62/235* (2025.01); *H10D 64/252* (2025.01); *H10D 64/514* (2025.01)

(58) Field of Classification Search
CPC ............. H01L 29/7827; H01L 29/0847; H01L 29/1033; H01L 29/41741; H01L 29/42364; H01L 29/785; H01L 29/1606; H01L 29/165; H01L 29/42392; H01L 29/78696
USPC ........................................................ 257/329
See application file for complete search history.

(56) References Cited

U.S. PATENT DOCUMENTS

| | | | |
|---|---|---|---|
| 8,476,765 | B2 | 7/2013 | Zhang et al. |
| 8,541,769 | B2 | 9/2013 | Chu et al. |
| 9,482,960 | B2 | 11/2016 | Yakunin et al. |
| 9,722,068 | B2 | 8/2017 | Wenxu et al. |

(Continued)

FOREIGN PATENT DOCUMENTS

| | | |
|---|---|---|
| CN | 107482064 B | 10/2019 |
| KR | 102107537 B1 | 5/2020 |

OTHER PUBLICATIONS

Extended European Search Report dated Jan. 9, 2023, issued in corresponding European Patent Application No. 22186328.5.

*Primary Examiner* — Mohammad M Hoque
(74) *Attorney, Agent, or Firm* — HARNESS, DICKEY & PIERCE, P.L.C.

(57) ABSTRACT

A vertical channel transistor includes a first source/drain electrode; a second source/drain electrode spaced apart from the first source/drain electrode in a first direction; a first channel pattern between the first source/drain electrode and the second source/drain electrode; a first gate electrode on a side surface of the first channel pattern; a first gate insulation layer between the first channel pattern and the first gate electrode; and a first graphene insertion layer between the first source/drain electrode and the first channel pattern.

19 Claims, 7 Drawing Sheets

(56) References Cited

U.S. PATENT DOCUMENTS

| | | |
|---|---|---|
| 10,121,981 B2 | 11/2018 | Ali et al. |
| 10,312,329 B2 | 6/2019 | Zhou |
| 10,714,624 B2 | 7/2020 | Bu |
| 12,131,905 B2* | 10/2024 | Shin ........................ C23C 16/50 |
| 2013/0001573 A1* | 1/2013 | Lee .................... H01L 29/41733 |
| | | 438/156 |
| 2019/0348466 A1 | 11/2019 | Pillarisetty et al. |
| 2020/0035611 A1* | 1/2020 | Byun ................ H01L 21/76846 |
| 2021/0050443 A1* | 2/2021 | Karda ................. H01L 29/7827 |
| 2021/0151558 A1 | 5/2021 | Bi et al. |
| 2021/0313229 A1* | 10/2021 | Xie ...................... H01L 23/5226 |

* cited by examiner

VERTICAL CHANNEL TRANSISTOR INCLUDING A GRAPHENE INSERTION LAYER BEWEEEN A SOURCE/DRAIN ELECTRODE AND A CHANNEL PATTERN

CROSS-REFERENCE TO RELATED APPLICATION

This application is based on and claims priority under 35 U.S.C. § 119 to Korean Patent Application No. 10-2021-0121173, filed on Sep. 10, 2021, in the Korean Intellectual Property Office, the disclosure of which is incorporated by reference herein in its entirety.

BACKGROUND

1. Field

The present disclosure relates to a vertical channel transistor.

2. Description of the Related Art

As the degree of integration of semiconductor devices increases, in order to reduce an area occupied by each unit device in a top view, a device having a vertical channel structure, such as a vertical channel array transistor (VCAT) (hereinafter referred to as a vertical channel transistor), in which a source and a drain are arranged vertically has been proposed. Compared with a horizontal channel transistor, a relatively large number of devices may be integrated in the same area in a vertical channel transistor. Since a vertical channel transistor has a different form than previous devices, the manufacturing process with an existing material may become very complicated and a high-level manufacturing technology may be demanded.

SUMMARY

Provided are vertical channel transistors including graphene in a junction between a conductor and a semiconductor, a junction between a conductor and an insulator, and a junction between a semiconductor and an insulator.

However, example embodiments are not limited thereto.

Additional aspects will be set forth in part in the description which follows and, in part, will be apparent from the description, or may be learned by practice of the presented embodiments of the disclosure.

According to an embodiment, a vertical channel transistor may include a first source/drain electrode; a second source/drain electrode spaced apart from the first source/drain electrode in a first direction; a first channel pattern between the first source/drain electrode and the second source/drain electrode; a first gate electrode on a side surface of the first channel pattern; a first gate insulation layer between the first channel pattern and the first gate electrode; and a first graphene insertion layer between the first source/drain electrode and the first channel pattern.

In some embodiments, a region of a surface of the first source/drain electrode may face a surface of the first gate insulation layer in the first direction, and the first graphene insertion layer may extend in a second direction between the first gate insulation layer and the first source/drain electrode. The second direction may cross the first direction.

In some embodiments, the vertical channel transistor may further include a first additional source/drain electrode between the first graphene insertion layer and the first channel pattern. The first source/drain electrode and the first additional source/drain electrode may include different materials from each other.

In some embodiments, a region of a surface of the first additional source/drain electrode may face a surface of the first gate insulation layer in the first direction and the first additional source/drain electrode may directly contact the gate insulation layer.

In some embodiments, the vertical channel transistor may further include a second graphene insertion layer between the second source/drain electrode and the first channel pattern.

In some embodiments, a thickness of at least one of the first graphene insertion layer and the second graphene insertion layer may be about 0.34 nanometers (nm) to about 3 nm.

In some embodiments, at least one of the first graphene insertion layer and the second graphene insertion layer may include crystals having sizes from about 0.5 nm to about 100 nm.

In some embodiments, a ratio of carbon atoms having a sp2 bonding structure with respect to entire carbon atoms in at least one of the first graphene insertion layer and the second graphene insertion layer may be 50% to 99%.

In some embodiments, at least one of the first graphene insertion layer and the second graphene insertion layer may have a density from about 1.6 g/cc to about 2.1 g/cc.

In some embodiments, the second graphene insertion layer may surround the second source/drain electrode.

In some embodiments, the vertical channel transistor may further include a second additional source/drain electrode between the second graphene insertion layer and the first channel pattern. The second source/drain electrode and the second additional source/drain electrode may include different materials.

In some embodiments, the first gate insulation layer may surround side surfaces of the first channel pattern, and the first gate electrode may extend along the first gate insulation layer and surround the first channel pattern.

In some embodiments, the vertical channel transistor may further include a second gate electrode opposite the first gate electrode across the first channel pattern; and a second gate insulation layer between the second gate electrode and the first channel pattern.

In some embodiments, the first gate electrode and the second gate electrode may be electrically isolated from each other.

In some embodiments, the vertical channel transistor may further include a passivation layer on the first source/drain electrode. The passivation layer may cover the second source/drain electrode. A region of the first graphene insertion layer may be between the passivation layer and the first source/drain electrode.

In some embodiments, the vertical channel transistor may further include a second graphene insertion layer between the second source/drain electrode and the first channel pattern. A region of the second graphene insertion layer may be between the passivation layer and the second source/drain electrode.

In some embodiments, the vertical channel transistor may further include a first additional source/drain electrode between the first graphene insertion layer and the first channel pattern. A region of a surface of the first graphene insertion layer may face the passivation layer in the first direction, and the first additional source/drain electrode may extend between the passivation layer and the first graphene insertion layer.

In some embodiments, the vertical channel transistor may further include a second graphene insertion layer between the second source/drain electrode and the first channel pattern. The passivation layer may include a first sub-passivation layer and a second sub-passivation layer stacked in the first direction, and the second graphene insertion layer may extend between the first sub-passivation layer and the second sub-passivation layer.

In some embodiments, the vertical channel transistor may further include a second channel pattern opposite the first channel pattern across first gate electrode; and a second gate insulation layer between the first gate electrode and the second channel pattern. The first channel pattern and the second channel pattern may be in a region where the first source/drain electrode and the second source/drain electrode face each other in the first direction.

In some embodiments, the vertical channel transistor may further include a second graphene insertion layer between the second source/drain electrode and the first channel pattern; a first insulation pattern between the first gate electrode and the first graphene insertion layer; a second insulation pattern between the first gate electrode and the second graphene insertion layer; and a third channel pattern between the second graphene insertion layer and the second insulation pattern. The first channel pattern, the second channel pattern, and the third channel pattern may constitute a single structure.

According to an embodiment, a vertical channel transistor may include a first source/drain electrode; a channel pattern on the first source/drain electrode; a second source/drain electrode on the channel pattern; a first graphene insertion layer between the first source/drain electrode and the channel pattern; a gate electrode over the first source/drain electrode; and a gate insulation layer on a sidewall of the channel pattern between the gate electrode and channel pattern. The second source/drain electrode may be spaced apart from the first source/drain electrode in a first direction. The gate electrode may be spaced apart from the first source/drain electrode in the first direction.

In some embodiments, the channel pattern may be between the first source/drain electrode and the second source/drain electrode.

In some embodiments, a second graphene insertion layer may be on the second source/drain electrode. A surface of the second graphene insertion layer may face a surface of the first source/drain electrode.

In some embodiments, an additional source/drain electrode may be between the first graphene insertion layer and the second graphene insertion layer.

In some embodiments, the gate electrode may be between the first source/drain electrode and a region of the channel pattern.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
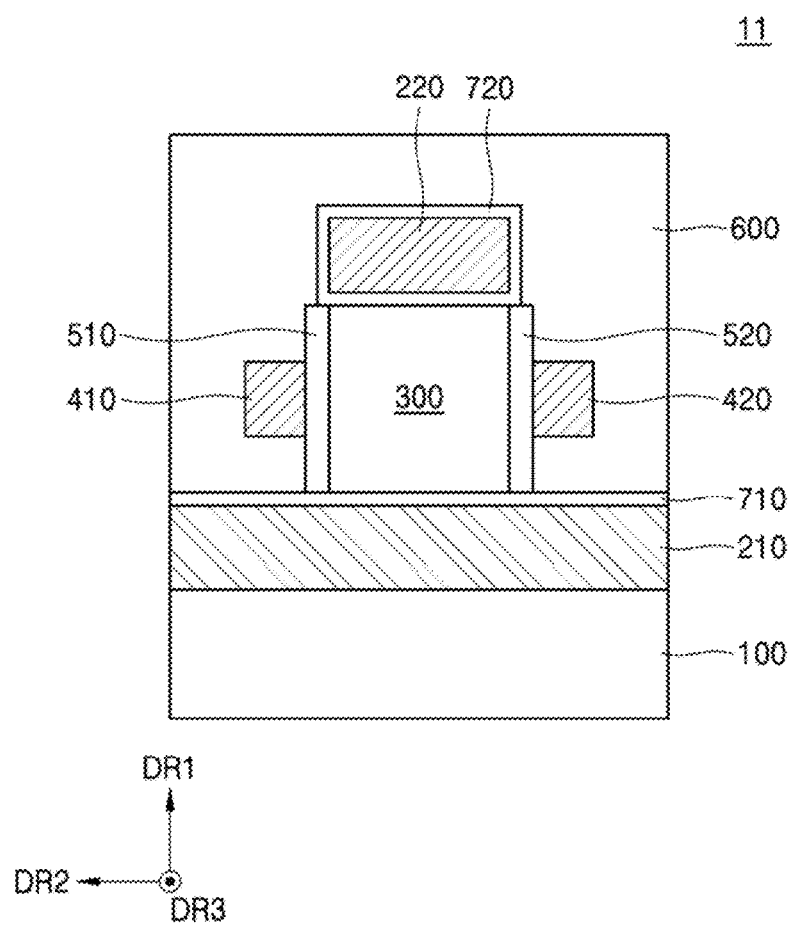
FIG. 1 is a cross-sectional view of a vertical channel transistor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments of the present disclosure will be described in detail with reference to the accompanying drawings. In the drawings, like reference numerals denote like elements, and the size and thickness of each element may be exaggerated for clarity of explanation. Meanwhile, the embodiments described below are merely examples, and various modifications are possible from these embodiments.

Hereinafter, what is described as being "above" or "on" may include not only that which is directly above in contact, but also that which is above in a non-contact manner.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements.

In addition, terms such as " . . . unit" used in the specification refers to a unit of processes at least one function or operation.

Hereinafter, it should be understood that 'at least one of a, b, and c' includes 'only a', 'only b', 'only c', 'a and b', 'a and c', 'b and c', or 'a, b, and c'.

FIG. 1 is a cross-sectional view of a vertical channel transistor according to an example embodiment.

Referring to FIG. 1, a vertical channel transistor 11 may be provided. The vertical channel transistor 11 may include a substrate 100, a first source/drain electrode 210, a second source/drain electrode 220, a channel pattern 300, a first gate electrode 410, a second gate electrode 420, a first gate insulation layer 510, a second gate insulation layer 520, a passivation layer 600, a first graphene insertion layer 710, and a second graphene insertion layer 720. The substrate 100 may include an insulation material and/or a semiconductor material. For example, the substrate 100 may be an intrinsic semiconductor substrate, a glass substrate, a sapphire substrate, or a substrate including silicon oxide.

The first source/drain electrode 210 may be provided on the substrate 100. In an embodiment of the present disclosure, the first source/drain electrode 210 may be a source electrode of a transistor device. The first source/drain electrode 210 may include a metal or a metal alloy. For example, the first source/drain electrode 210 may include copper (Cu), ruthenium (Ru), aluminum (Al), cobalt (Co), tungsten (W), molybdenum (Mo), titanium (Ti), tantalum (Ta), nickel (Ni), platinum (Pt), chromium (Cr), or an alloy thereof.

The second source/drain electrode 220 may be provided on the first source/drain electrode 210. The second source/drain electrode 220 may be spaced apart from the first source/drain electrode 210 in a first direction DR1. For example, the first direction DR1 may be perpendicular to the top surface of the substrate 100. When the first source/drain electrode 210 is a source electrode of a transistor device, the second source/drain electrode 220 may be a drain electrode of the transistor device. The second source/drain electrode 220 may include a metal or a metal alloy. For example, the second source/drain electrode 220 may include Cu, Ru, Al, Co, W, Mo, Ti, Ta, Ni, Pt, C), or an alloy thereof.

The channel pattern 300 may be provided between the first source/drain electrode 210 and the second source/drain electrode 220. The channel pattern 300 may include a semiconductor material. For example, the channel pattern 300 may include silicon (Si), germanium (Ge), or silicon germanium (SiGe). The channel pattern 300 may extend in the first direction DR1. The shape of the channel pattern 300 may be determined as needed. According to an embodiment of the present disclosure, the channel pattern 300 may have a pillar-like shape extending in the first direction DR1. For example, the channel pattern 300 may have a cylindrical shape. According to an embodiment of the present disclosure, the channel pattern 300 may have a fin-like shape extending in a third direction DR3 intersecting with the first direction DR1 and a second direction DR2.

Figure 5A:
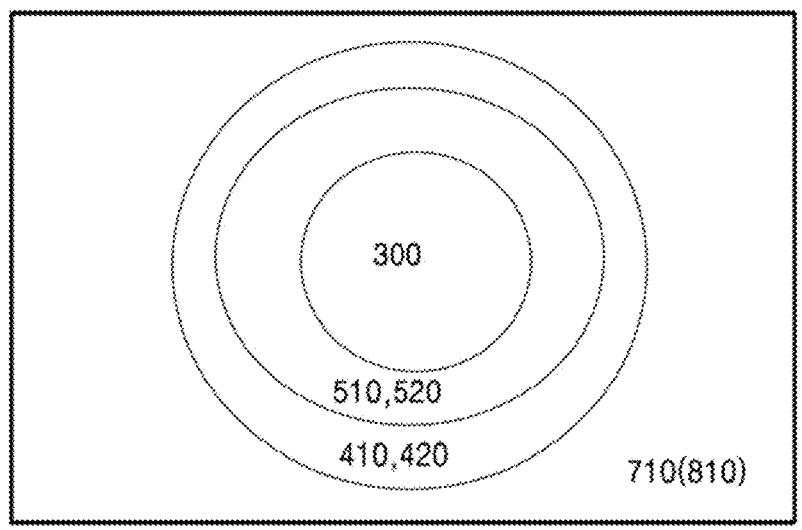
FIGS. 5A and 5B are plan views of parts of vertical channel transistors according to some example embodiments.

The first gate electrode 410 and the second gate electrode 420 may be provided on one side and the other side of the channel pattern 300, respectively. In an embodiment of the present disclosure, the first gate electrode 410 and the second gate electrode 420 may be gate electrodes of a transistor. According to an embodiment of the present disclosure, the first gate electrode 410 and the second gate electrode 420 may be connected to each other. For example, FIG. 5A illustrates a plan view for an example of a part of the vertical channel transistor 11 in FIG. 1 according to some example embodiments. As depicted in FIGS. 1 and 5A, the channel pattern 300 may have a pillar-like shape, and the first gate electrode 410 and the second gate electrode 420 may be different portions of one gate electrode surrounding the channel pattern 300.

Figure 5B:
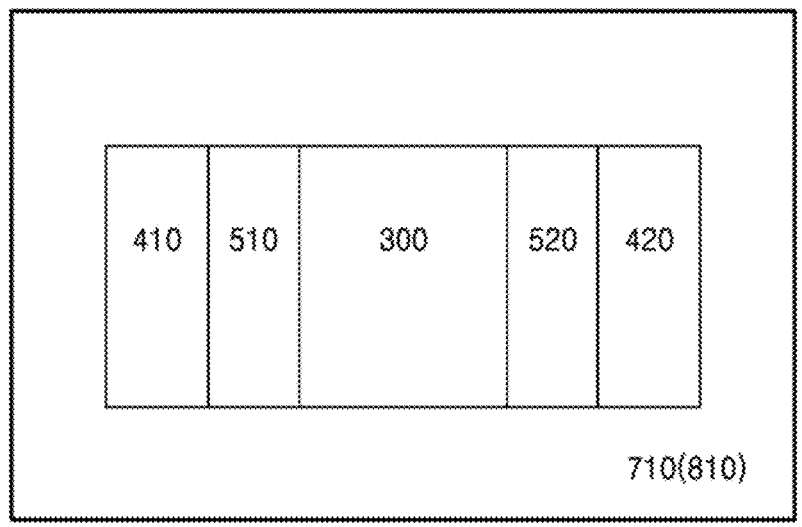

According to an embodiment of the present disclosure, the first gate electrode 410 and the second gate electrode 420 may be spaced apart from each other. For example, FIG. 5B illustrates a plan view for an example of a part of the vertical channel transistor 11 in FIG. 1 according to some example embodiments. As depicted in FIGS. 1 and 5B, the channel pattern 300 may have a fin-like shape, and the first gate electrode 410 and the second gate electrode 420 may be arranged both sides of the channel pattern 300 to be spaced apart from each other. The first gate electrode 410 and the second gate electrode 420 may include an electrically conductive material. For example, the first gate electrode 410 and the second gate electrode 420 may include gold (Au). When the vertical channel transistor 11 is driven, the same voltage may be applied to the first gate electrode 410 and the second gate electrode 420.

The first gate insulation layer 510 may be provided between the channel pattern 300 and the first gate electrode 410. The first gate insulation layer 510 may include an insulation material. For example, the first gate insulation layer 510 may include silicon oxide (e.g., $SiO_2$), silicon nitride (e.g., SiN), silicon oxynitride (e.g., SiON), or a high-k material (e.g., $Al_2O_3$, $HfO_2$, $ZrO_2$).

The second gate insulation layer 520 may be provided between the channel pattern 300 and the second gate electrode 420. The second gate insulation layer 520 may include an insulation material. For example, the second gate insulation layer 520 may include silicon oxide (e.g., $SiO_2$), silicon nitride (e.g., SiN), silicon oxynitride (e.g., SiON), or a high-k material (e.g., $Al_2O_3$, $HfO_2$, $ZrO_2$).

According to an embodiment of the present disclosure, the first gate insulation layer 510 and the second gate insulation layer 520 may be connected to each other. For example, as depicted in FIGS. 1 and 5A, the first gate insulation layer 510 and the second gate insulation layer 520 may be different portions of one insulation layer surrounding side surfaces of the channel pattern 300. Alternatively, according to an embodiment of the present disclosure, as depicted in FIGS. 1 and 5B, the first gate insulation layer 510 and the second gate insulation layer 520 may be spaced apart from each other.

A passivation layer 600 may be provided on the substrate 100. The passivation layer 600 may protect components provided on the substrate 100. For example, the passivation layer 600 may cover the first gate electrode 410, the second gate electrode 420, the first source/drain electrode 210, and the second source/drain electrode 220. The passivation layer 600 may include an insulation material. For example, the passivation layer 600 may include silicon oxide (e.g., $SiO_2$), silicon nitride (e.g., SiN), or silicon oxynitride (e.g., SiON).

The first graphene insertion layer 710 may be provided between the first source/drain electrode 210 and the channel pattern 300. The first graphene insertion layer 710 may have a single layer structure or a multilayer structure in which a plurality of layers are stacked. The first graphene insertion layer 710 may include nanocrystalline graphene. The nanocrystalline graphene may be graphene including crystals having a size smaller than that of crystals of intrinsic graphene, which is common crystalline graphene. The nanocrystalline graphene may include crystals having a nano-level size, e.g., from about 0.5 nm to about 100 nm. In the nanocrystalline graphene, the ratio of carbon atoms having an sp2 bond structure with respect to the all carbon atoms may be, for example, from about 50% to about 100%. The nanocrystalline graphene may include, for example, from about 1 at % (atomic percent) to about 20 at % of hydrogen. The density of the nanocrystalline graphene may be, for example, from about 1.6 g/cc to about 2.1 g/cc, and the sheet resistance of the nanocrystalline graphene may be, for example, greater than about 1000 Ohm/sq. The thickness of the first graphene insertion layer 710 may be from about 0.34 nm to about 3 nm.

The first graphene insertion layer 710 may be an ohmic contact layer configured to provide an ohmic contact between the channel pattern 300 to the first source/drain electrode 210. The first graphene insertion layer 710 may be a diffusion barrier that limits and/or prevents a dopant of the channel pattern 300 from diffusing into the first source/drain electrode 210. For example, the first graphene insertion layer 710 may limit and/or prevent diffusion of phosphorus (P) atoms and oxygen (O) atoms of the channel pattern 300.

The first graphene insertion layer 710 may extend to a region between the first source/drain electrode 210 and the passivation layer 600. The first graphene insertion layer 710 may pass through at least one of a region between the first gate insulation layer 510 and the first source/drain electrode 210 and a region between the second gate insulation layer 520 and the first source/drain electrode 210. According to an embodiment of the present disclosure, the first graphene insertion layer 710 may directly contact at least one of the first gate insulation layer 510 and the second gate insulation layer 520. The first graphene insertion layer 710 may extend along the top surface of the first source/drain electrode 210. The first source/drain electrode 210 and the passivation layer 600 may be spaced apart from each other by the first graphene insertion layer 710. The first graphene insertion layer 710 may limit and/or prevent diffusion of a material of the first source/drain electrode 210 into the passivation layer 600 between the first source/drain electrode 210 and the passivation layer 600 (e.g., electromigration). The first graphene insertion layer 710 may lower the resistance of the first source/drain electrode 210 and improve process stability. The first graphene insertion layer 710 may be a capping layer covering the first source/drain electrode 210.

The second graphene insertion layer 720 may be provided between the second source/drain electrode 220 and the channel pattern 300. The second graphene insertion layer 720 may include nanocrystalline graphene. The second graphene insertion layer 720 may have a single layer structure or a multilayer structure in which a plurality of layers are stacked. The thickness of the second graphene insertion layer 720 may be from about 0.34 nm to about 3 nm. The second graphene insertion layer 720 may be an ohmic contact layer configured to provide an ohmic contact between the channel pattern 300 to the second source/drain electrode 220. The second graphene insertion layer 720 may be a diffusion barrier that limits and/or prevents a dopant of the channel pattern 300 from diffusing into the second source/drain electrode 220. For example, the second graphene insertion layer 720 may limit and/or prevent diffusion of P atoms and O atoms of the channel pattern 300.

The second graphene insertion layer 720 may extend to a region between the second source/drain electrode 220 and the passivation layer 600. According to an embodiment of the present disclosure, the second graphene insertion layer 720 may pass through at least one of a region between the first gate insulation layer 510 and the second source/drain electrode 220 and a region between the second gate insulation layer 520 and the second source/drain electrode 220. For example, the second graphene insertion layer 720 may directly contact at least one of the first gate insulation layer 510 and the second gate insulation layer 520. The second graphene insertion layer 720 may extend along a surface (e.g., the bottom surface, the top surface, and two side surfaces opposite to each other) of the second source/drain electrode 220. The second graphene insertion layer 720 may surround the second source/drain electrode 220. The second source/drain electrode 220 and the passivation layer 600 may be spaced apart from each other by the second graphene insertion layer 720. The second graphene insertion layer 720 may limit and/or prevent diffusion of a material of the second source/drain electrode 220 into the passivation layer 600 between the second source/drain electrode 220 and the passivation layer 600 (e.g., electromigration). The second graphene insertion layer 720 may lower the resistance of the second source/drain electrode 220 and improve process stability. The second graphene insertion layer 720 may be a capping layer covering the second source/drain electrode 220.

The present disclosure may provide the vertical channel transistor 11 in which an ohmic contact layer, a diffusion barrier layer, and a passivation layer between the channel pattern 300 and the source/drain electrodes 210 and 220 and a capping layer between source/drain electrodes 210 and 220 are graphene layers. In other words, the present disclosure may provide the vertical channel transistor 11 in which graphene is used for a junction between a conductor and a semiconductor, a junction between a conductor and an insulator, and a junction between a semiconductor and an insulator. When an ohmic contact layer, a diffusion barrier layer, and a capping layer include different materials, a plurality of deposition and patterning processes are needed. According to the present disclosure, since an ohmic contact layer, a diffusion barrier layer, and a capping layer include graphene (e.g., nanocrystalline graphene), the overall manufacturing process may be simplified.

When an ohmic contact layer, a diffusion barrier layer, and a capping layer include different materials, deterioration may occur due to intermixing between compositions of layers during deposition. Also, in the case of a double layer, unintended capacitance between layers may occur, and thus electrical noise, transmission speed delay, etc. may occur. In other words, when an ohmic contact layer, a diffusion barrier layer, and a capping layer include different materials, crosstalk may occur between the ohmic contact layer, the diffusion barrier layer, and the capping layer.

In the present disclosure, since an ohmic contact layer, a diffusion barrier, and a capping layer include graphene (e.g., nanocrystalline graphene), crosstalk between layers may be limited and/or prevented.

Figure 2:
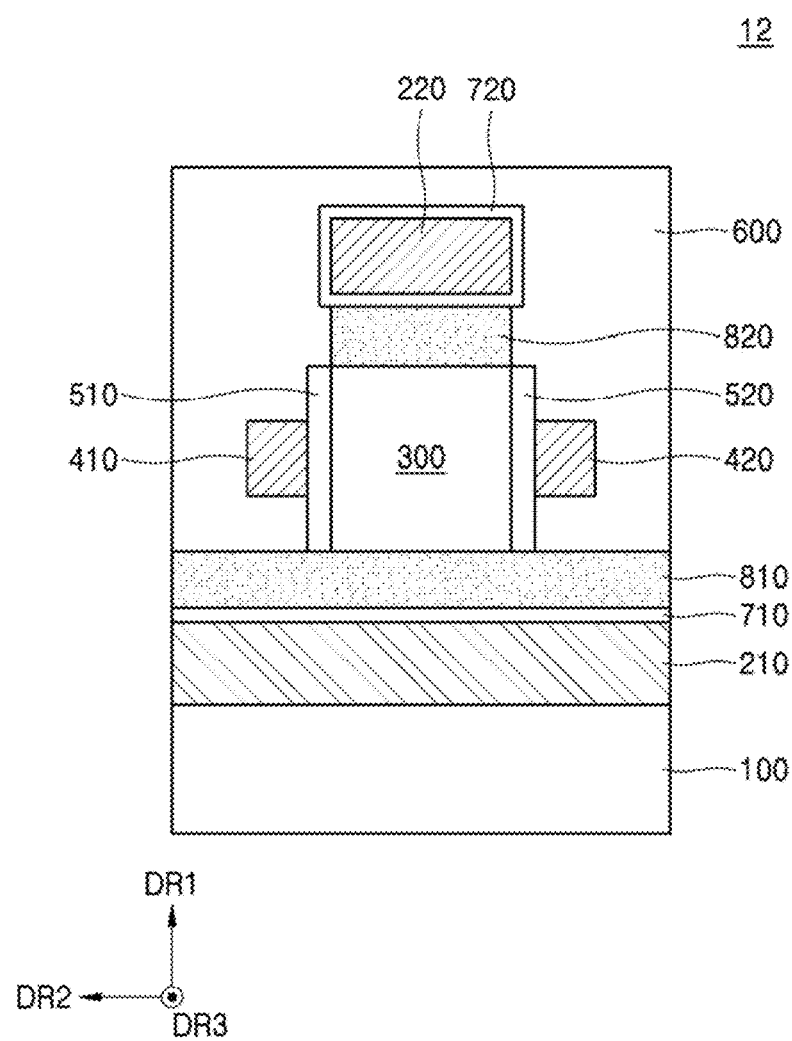
FIG. 2 is a cross-sectional view of a vertical channel transistor according to an example embodiment.

FIG. 2 is a cross-sectional view of a vertical channel transistor according to an example embodiment. For brevity of description, descriptions substantially identical to those given above with reference to FIG. 1 may not be given.

Referring to FIG. 2, a vertical channel transistor 12 may be provided. The vertical channel transistor 12 may include the substrate 100, the first source/drain electrode 210, the second source/drain electrode 220, the channel pattern 300, the first gate electrode 410, the second gate electrode 420, the first gate insulation layer 510, the second gate insulation layer 520, the passivation layer 600, the first graphene insertion layer 710, the second graphene insertion layer 720, a first additional source/drain electrode 810, and a second additional source/drain electrode 820.

The substrate 100, the first source/drain electrode 210, the second source/drain electrode 220, the channel pattern 300, the first gate electrode 410, the second gate electrode 420, the first gate insulation layer 510, the second gate insulation layer 520, the passivation layer 600, the first graphene insertion layer 710, and the second graphene insertion layer 720 may be substantially the same as those described above with reference to FIG. 1.

The first additional source/drain electrodes 810 may be provided between the first graphene insertion layer 710 and the channel pattern 300. The first additional source/drain electrode 810 may extend into a region between the first source/drain electrode 210 and the passivation layer 600. The first additional source/drain electrodes 810 may pass through at least one of a region between the first gate insulation layer 510 and the first source/drain electrode 210 and a region between the second gate insulation layer 520 and the first source/drain electrode 210. According to an embodiment of the present disclosure, the first additional source/drain electrodes 810 may directly contact at least one of the first gate insulation layer 510 and the second gate insulation layer 520. The first additional source/drain electrodes 810 may face the channel pattern 300, the first gate insulation layer 510, the second gate insulation layer 520, and the passivation layer 600 in the second direction DR2. The first additional source/drain electrode 810 may include a material different from that constituting the first source/drain electrode 210. For example, the first additional source/drain electrode 810 may include a doped semiconductor material (e.g., doped-Si).

The second additional source/drain electrode 820 may be provided between the second graphene insertion layer 720 and the channel pattern 300. For example, the top surface and the bottom surface of the second additional source/drain electrode 820 may directly contact the second graphene insertion layer 720 and the channel pattern 300, respectively. Side surfaces of the second additional source/drain electrode 820 may directly contact the passivation layer 600. Although FIG. 2 shows that the second additional source/drain electrode 820 is not provided on the first gate insulation layer 510 and the second gate insulation layer 520, the present disclosure is not limited thereto. According to another embodiment, the second additional source/drain electrode 820 may extend to regions on the first gate insulation layer 510 and the second gate insulation layer 520. The second additional source/drain electrode 820 may include a material different from that constituting the second source/drain electrode 220. For example, the second additional source/drain electrode 820 may include a doped semiconductor material (e.g., doped-Si).

The present disclosure may provide the vertical channel transistor 12 in which graphene is used for a junction between a conductor and a semiconductor, a junction between a conductor and an insulator, and a junction between a semiconductor and an insulator.

Like the vertical channel transistor 11 described above with reference to FIGS. 1, 5A, and 5B, in some embodiments, the first gate electrode 410 and the second gate electrode 420 of the vertical channel transistor 12 may be connected to each other and provide one gate electrode (see FIG. 5A) and the first gate insulation layer 510 and the second gate insulation layer 520 of the vertical channel transistor 12 may be connected to each other and provide one gate insulation layer (see FIG. 5A). Alternatively, the first gate electrode 410 and the second gate electrode 420 of the vertical channel transistor 12 may be spaced apart from each other across the channel pattern 300 (see FIG. 5B) and the first gate insulation layer 510 and the second gate insulation layer 520 of the vertical channel transistor 12 may be spaced apart from each other across the channel pattern 300 (see FIG. 5B).

Figure 3:
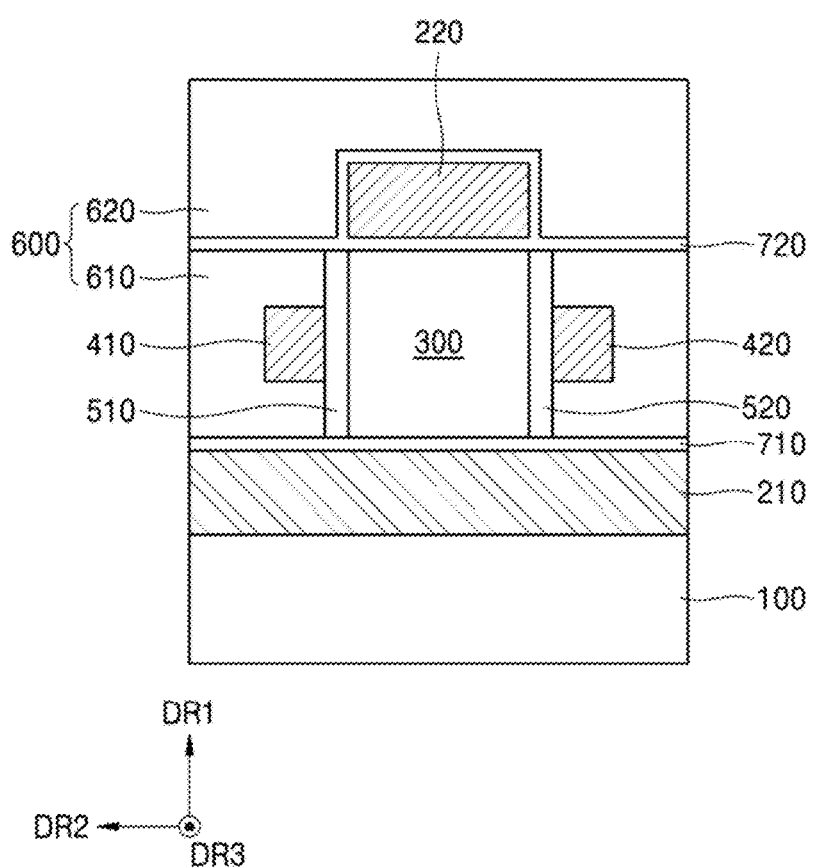
FIG. 3 is a cross-sectional view of a vertical channel transistor according to an example embodiment.

FIG. 3 is a cross-sectional view of a vertical channel transistor according to an example embodiment. For brevity of description, descriptions substantially identical to those given above with reference to FIG. 1 may not be given.

Referring to FIG. 3, a vertical channel transistor 13 may be provided. The vertical channel transistor 13 may include the substrate 100, the first source/drain electrode 210, the second source/drain electrode 220, the channel pattern 300, the first gate electrode 410, the second gate electrode 420, the first gate insulation layer 510, the second gate insulation layer 520, the passivation layer 600, the first graphene insertion layer 710, and the second graphene insertion layer 720.

The substrate 100, the first source/drain electrode 210, the second source/drain electrode 220, the channel pattern 300, the first gate electrode 410, the second gate electrode 420, the first gate insulation layer 510, the second gate insulation layer 520, and the first graphene insertion layer 710 may be substantially the same as those described above with reference to FIG. 1.

The passivation layer 600 may include a first sub-passivation layer 610 and a second sub-passivation layer 620. The first sub-passivation layer 610 may be provided on side surfaces of the channel pattern 300. The first sub-passivation layer 610 may cover the first gate electrode 410, the second gate electrode 420, the first gate insulation layer 510, and the second gate insulation layer 520. According to an embodiment of the present disclosure, the top surface of the first sub-passivation layer 610 and the top surface of the channel pattern 300 may be arranged at the same height from the top surface of the substrate 100.

The second sub-passivation layer 620 may be provided on the first sub-passivation layer 610. The second sub-passivation layer 620 may cover the second source/drain electrodes 220. The first sub-passivation layer 610 and the second sub-passivation layer 620 may include an insulation material. For example, the first sub-passivation layer 610 and the second sub-passivation layer 620 may include silicon oxide (e.g., $SiO_2$), silicon nitride (e.g., SiN), and silicon oxynitride (e.g., SiON). According to an embodiment of the present disclosure, the first sub-passivation layer 610 and the second sub-passivation layer 620 may include the same material.

The second graphene insertion layer 720 may extend to a region between the first sub-passivation layer 610 and the second sub-passivation layer 620. The first sub-passivation layer 610 and the second sub-passivation layer 620 may be spaced apart from each other by the second graphene insertion layer 720.

The present disclosure may provide the vertical channel transistor 13 in which graphene is used for a junction between a conductor and a semiconductor, a junction between a conductor and an insulator, and a junction between a semiconductor and an insulator.

Like the vertical channel transistor 11 described above with reference to FIGS. 1, 5A, and 5B, in some embodiments, the first gate electrode 410 and the second gate electrode 420 of the vertical channel transistor 13 may be connected to each other and provide one gate electrode (see FIG. 5A) and the first gate insulation layer 510 and the second gate insulation layer 520 of the vertical channel transistor 13 may be connected to each other and provide one gate insulation layer (see FIG. 5A). Alternatively, the first gate electrode 410 and the second gate electrode 420 of the vertical channel transistor 13 may be spaced apart from each other across the channel pattern 300 (see FIG. 5B) and the first gate insulation layer 510 and the second gate insulation layer 520 of the vertical channel transistor 13 may be spaced apart from each other across the channel pattern 300 (see FIG. 5B).

Figure 4:
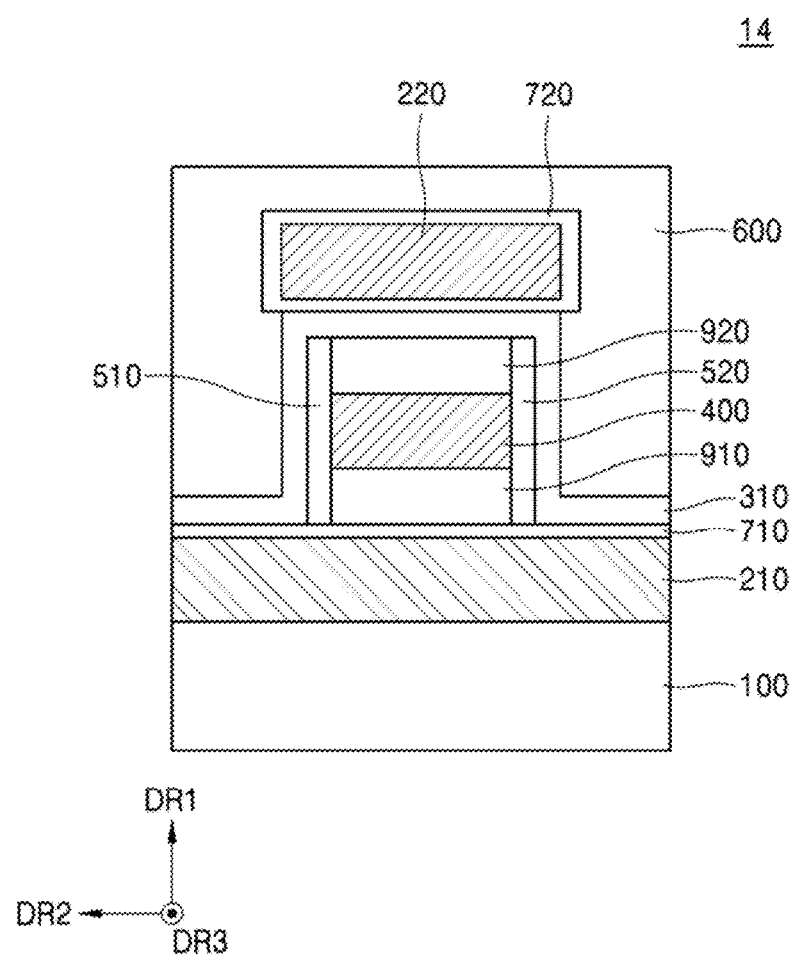
FIG. 4 is a cross-sectional view of a vertical channel transistor according to an example embodiment.

FIG. 4 is a cross-sectional view of a vertical channel transistor according to an example embodiment. For brevity of description, descriptions substantially identical to those given above with reference to FIG. 1 may not be given.

Referring to FIG. 4, a vertical channel transistor 14 may be provided. The vertical channel transistor 12 may include the substrate 100, the first source/drain electrode 210, the second source/drain electrode 220, a channel pattern 310, a gate electrode 400, the first gate insulation layer 510, the second gate insulation layer 520, the passivation layer 600, the first graphene insertion layer 710, the second graphene insertion layer 720, a first insulation pattern 910, and a second insulation pattern 920.

The substrate 100, the first source/drain electrode 210, the second source/drain electrode 220, the first gate insulation layer 510, the second gate insulation layer 520, the passivation layer 600, the first graphene insertion layer 710, and the second graphene insertion layer 720 may be substantially identical to those described above with reference to FIG. 1.

The gate electrode 400 may be provided between the first gate insulation layer 510 and the second gate insulation layer 520. According to an embodiment of the present disclosure, a side surface of the gate electrode 400 may contact the first gate insulation layer 510, and another side surface of the gate electrode 400 may contact the second gate insulation layer 520. In an embodiment of the present disclosure, the gate electrode 400 may be a gate electrode of a transistor device. The gate electrode 400 may include an electrically conductive material. For example, the gate electrode 400 may include Au.

The first insulation pattern 910 may be provided between the gate electrode 400 and the first graphene insertion layer 710. The first insulation pattern 910 may electrically insulate the first graphene insertion layer 710 from the gate electrode 400. The first insulation pattern 910 may include an electrically insulating material. For example, the first insulation pattern 910 may include silicon oxide (e.g., $SiO_2$), silicon nitride (e.g., SiN), or silicon oxynitride (e.g., SiON). According to an embodiment of the present disclosure, a side surface of the first insulation pattern 910 may contact the first gate insulation layer 510, and another side surface of the first insulation pattern 910 may contact the second gate insulation layer 520.

The second insulation pattern 920 may be provided between the gate electrode 400 and the second graphene insertion layer 720. The second insulation pattern 920 may electrically insulate the second graphene insertion layer 720 from the gate electrode 400. The second insulation pattern 920 may include an electrically insulating material. For example, the second insulation pattern 920 may include silicon oxide (e.g., $SiO_2$), silicon nitride (e.g., SiN), or silicon oxynitride (e.g., SiON). According to an embodiment of the present disclosure, a side surface of the second insulation pattern 920 may contact the first gate insulation layer 510, and another side surface of the second insulation pattern 920 may contact the second gate insulation layer 520. According to an embodiment of the present disclosure, the top surface of the second insulation pattern 920 may be disposed at the same height as the top surface of the first gate insulation layer 510 and the top surface of the second gate insulation layer 520 from the top surface of the substrate 100.

The channel pattern 310 may extend along surfaces of the first graphene insertion layer 710, the first gate insulation layer 510, the second insulation pattern 920, and the second gate insulation layer 520. The channel pattern 310 on surfaces of the first graphene insertion layer 710, the first gate insulation layer 510, and the second gate insulation layer 520 may be located between the passivation layer 600 and the first graphene insertion layer 710, the first gate insulation layer 510, and the second gate insulation layer 520. On the second insulation pattern 920, the channel pattern 310 may be located between the second insulation pattern 920 and the second graphene insertion layer 720. Channels may be formed in a region opposite to the gate electrode 400 with respect to the first gate insulation layer 510 and a region opposite to the gate electrode 400 with respect to the second gate insulation layer 520, respectively. The channel pattern 310 may include a semiconductor material. For example, the channel pattern 310 may include S), Ge, or SiGe.

The present disclosure may provide the vertical channel transistor 14 in which graphene is used for a junction between a conductor and a semiconductor, a junction between a conductor and an insulator, and a junction between a semiconductor and an insulator.

The present disclosure may provide the vertical channel transistor in which graphene is used for a junction between a conductor and a semiconductor, a junction between a conductor and an insulator, and a junction between a semiconductor and an insulator.

However, the effect of the present disclosure is not limited thereto.

Figure 6:
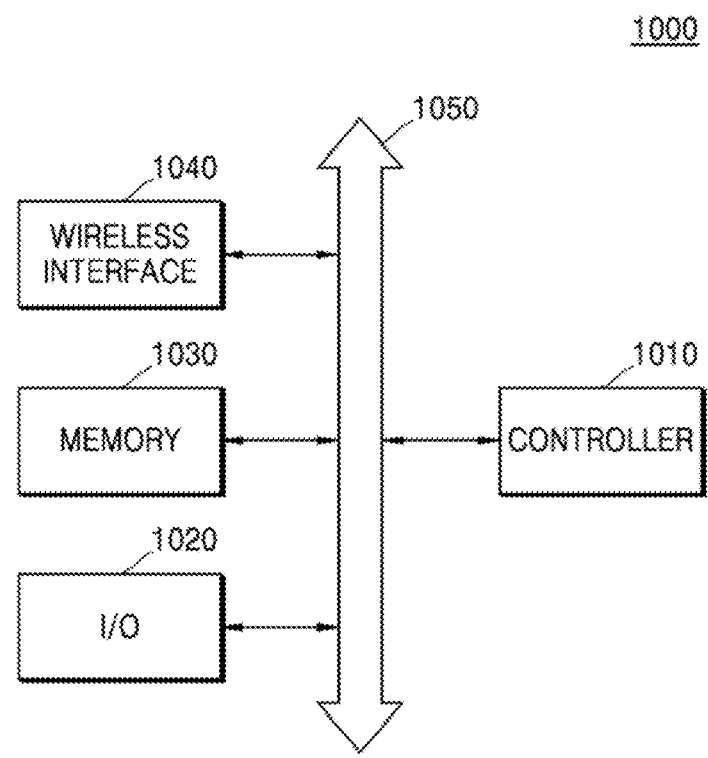
FIGS. 6 and 7 are block diagrams of electronic systems according to some example embodiments.
Figure 7:
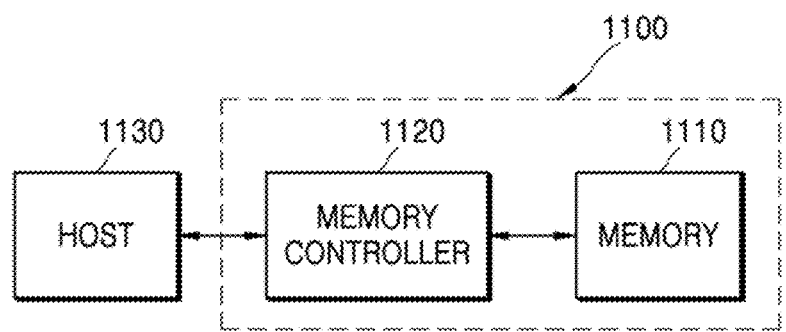

FIGS. 6 and 7 are block diagrams of electronic systems according to some example embodiments.

Referring to FIG. 6, in an example embodiment, an electronic system 1000 may form a wireless communication device or a device capable of transmitting and/or receiving information in a wireless environment. The electronic system 1000 may include a controller 1010, an input/output device (I/O) 1020, a memory 1030, and a wireless interface 1040, which are connected to each other through a bus 1050.

The controller 1010 may include at least one selected from the group consisting of a microprocessor, a digital signal processor, and a processing device similar thereto. Users commands may be input through the I/O device 1020 for the controller 1010, and the I/O device 1020 may include at least one selected from the group consisting of a keypad, a keyboard, and a display. The memory 1030 may be used to store instructions executed by controller 1010. For example, the memory 1030 may be used to store user data. The electronic system 1000 may use the wireless interface 1040 to transmit/receive data through a wireless communication network. The wireless interface 1040 may include an antenna and/or a wireless transceiver. In some embodiments, the electronic system 1000 may be used for communication interface protocols (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The electronic system 1000 may include at least one of the vertical channel transistors 11 to 14 according to the various embodiments described above. For example, the memory 1030 and/or controller 1010 may include at least one of the vertical channel transistors 11 to 14 described with reference to FIGS. 1 to 5B.

Referring to FIG. 7, in an example embodiment, an electronic system 1100 may include a memory 1110 and a memory controller 1120. The memory controller 1120 may control the memory 1110 to read data from the memory 1110 and/or write data to the memory 1110 in response to a request from a host 1130. At least one of the memory 1110 and the memory controller 1120 may include at least one of the vertical channel transistors 11 to 14, which are described with reference to FIGS. 1 to 5B according to the various embodiments.

Figure 8:
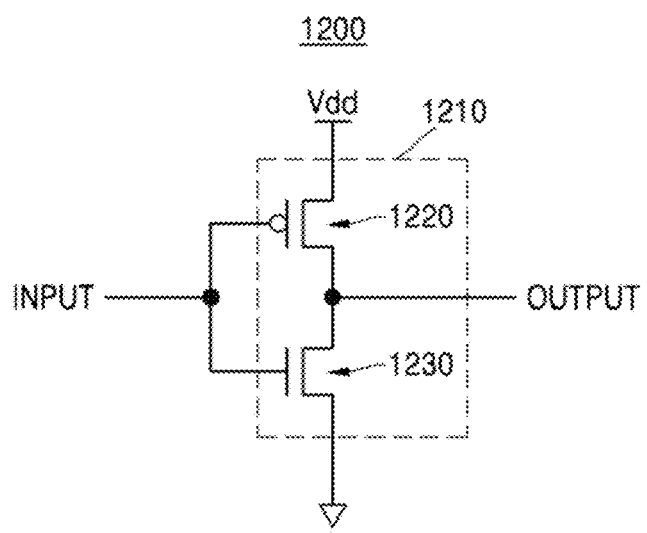
FIG. 8 is a diagram of an electronic circuit according to an example embodiment.

FIG. 8 is a diagram of an electronic circuit according to an example embodiment.

The electronic circuit 1200 may include a CMOS transistor 1210. The CMOS transistor 1210 may include a p-channel transistor 1220 and an n-channel transistor 1230, which are connected between a power terminal Vdd and a ground terminal. The CMOS transistor 1210 may include at least one of the vertical channel transistors 11, 12, 13, and 14 according to the various embodiments described above.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A vertical channel transistor comprising:
   a first source/drain electrode;
   a second source/drain electrode spaced apart from the first source/drain electrode in a first direction;
   a first channel pattern between a surface of the first source/drain electrode and a surface of the second source/drain electrode facing the surface of the first source/drain electrode;
   a first gate electrode on a side surface of the first channel pattern;
   a first gate insulation layer between the first channel pattern and the first gate electrode;
   a first graphene insertion layer between the first source/drain electrode and the first channel pattern; and
   a second graphene insertion layer between the second source/drain electrode and the first channel pattern, wherein the second graphene insertion layer fully surrounds the second source/drain electrode.

2. The vertical channel transistor of claim 1,
   wherein a region of the surface of the first source/drain electrode faces a surface of the first gate insulation layer in the first direction, and
   the first graphene insertion layer extends in a second direction between the first gate insulation layer and the first source/drain electrode, and
   the second direction crosses the first direction.

3. The vertical channel transistor of claim 1, further comprising:
   a first additional source/drain electrode between the first graphene insertion layer and the first channel pattern,
   wherein the first source/drain electrode and the first additional source/drain electrode comprise different materials from each other.

4. The vertical channel transistor of claim 3,
   wherein a region of a surface of the first additional source/drain electrode faces a surface of the first gate insulation layer in the first direction, and the first additional source/drain electrode directly contacts the first gate insulation layer.

5. The vertical channel transistor of claim 1, wherein a lower surface of the first gate insulation layer is coplanar with a lower surface of the first channel pattern.

6. The vertical channel transistor of claim 1,
   wherein a thickness of at least one of the first graphene insertion layer and the second graphene insertion layer is about 0.34 nanometers (nm) to about 3 nm.

7. The vertical channel transistor of claim 1,
   wherein at least one of the first graphene insertion layer and the second graphene insertion layer comprises crystals having domain sizes from about 0.5 nm to about 100 nm.

8. The vertical channel transistor of claim 1,
   wherein a ratio of carbon atoms having a sp2 bonding structure with respect to entire carbon atoms in at least one of the first graphene insertion layer and the second graphene insertion layer is 50% to 99%.

9. The vertical channel transistor of claim 1,
   wherein at least one of the first graphene insertion layer and the second graphene insertion layer has a density of about 1.6 g/cc to about 2.1 g/cc.

10. The vertical channel transistor of claim 1,
    wherein the first source/drain electrode includes a metal or a metal alloy.

11. The vertical channel transistor of claim 1,
    wherein the first gate insulation layer surrounds side surfaces of the first channel pattern, and
    the first gate electrode extends along the first gate insulation layer and surrounds the first channel pattern.

12. The vertical channel transistor of claim 1, further comprising:
    a second gate electrode opposite the first gate electrode across the first channel pattern; and
    a second gate insulation layer between the second gate electrode and the first channel pattern.

13. The vertical channel transistor of claim 1, further comprising:
    a passivation layer on the first source/drain electrode, the passivation layer covering the second source/drain electrode,
    wherein a region of the first graphene insertion layer is between the passivation layer and the first source/drain electrode.

14. The vertical channel transistor of claim 13, further comprising:
    a second graphene insertion layer between the second source/drain electrode and the first channel pattern,
    wherein a region of the second graphene insertion layer is between the passivation layer and the second source/drain electrode.

15. A vertical channel transistor comprising:
    a first source/drain electrode;
    a second source/drain electrode spaced apart from the first source/drain electrode in a first direction;
    a first channel pattern between the first source/drain electrode and the second source/drain electrode;
    a first gate electrode on a side surface of the first channel pattern;
    a first gate insulation layer between the first channel pattern and the first gate electrode;
    a first graphene insertion layer between the first source/drain electrode and the first channel pattern;
    a second channel pattern provided opposite the first channel pattern across first gate electrode; and a second gate insulation layer between the first gate electrode and the second channel pattern, wherein the first channel pattern and the second channel pattern are in a region where the first source/drain electrode and the second source/drain electrode face each other in the first direction.

16. The vertical channel transistor of claim 15, further comprising:

a second graphene insertion layer between the second source/drain electrode and the first channel pattern;

a first insulation pattern between the first gate electrode and the first graphene insertion layer;

a second insulation pattern between the first gate electrode and the second graphene insertion layer; and a third channel pattern between the second graphene insertion layer and the second insulation pattern, wherein the first channel pattern, the second channel pattern, and the third channel pattern constitute a single structure.

17. A vertical channel transistor comprising:

a first source/drain electrode;

a channel pattern on the first source/drain electrode;

a second source/drain electrode on the channel pattern, the second source/drain electrode being spaced apart from the first source/drain electrode in a first direction;

a first graphene insertion layer between the first source/drain electrode and the channel pattern;

a gate electrode over the first source/drain electrode and spaced apart from the first source/drain electrode in the first direction; and a gate insulation layer on a sidewall of the channel pattern between the gate electrode and channel pattern, wherein the gate electrode is between the first source/drain electrode and a region of the channel pattern.

18. The vertical channel transistor of claim 17, wherein the channel pattern is between the first source/drain electrode and the second source/drain electrode.

19. The vertical channel transistor of claim 17, further comprising:

a second graphene insertion layer on the second source/drain electrode, wherein a surface of the second graphene insertion layer faces a surface of the first source/drain electrode.

* * * * *